US012812848B2

(12) United States Patent
Weng et al.

(10) Patent No.: US 12,812,848 B2
(45) Date of Patent: Nov. 24, 2026

(54) FLASH MEMORY CELL ARRAYS WITH A CONTROL GATE STRAP

(71) Applicant: GlobalFoundries Singapore Pte. Ltd., Singapore (SG)

(72) Inventors: Jialin Weng, Singapore (SG); Kian Hong Lim, Singapore (SG); Fan Zhang, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 441 days.

(21) Appl. No.: 18/582,814

(22) Filed: Feb. 21, 2024

(65) Prior Publication Data

US 2025/0267861 A1 Aug. 21, 2025

(51) Int. Cl.

*H10B 41/10* (2023.01)
*H10B 41/30* (2023.01)
*H10D 30/01* (2025.01)
*H10D 30/68* (2025.01)

(52) U.S. Cl.

CPC ............. *H10B 41/10* (2023.02); *H10B 41/30* (2023.02); *H10D 30/0411* (2025.01); *H10D 30/683* (2025.01); *H10D 30/6892* (2025.01)

(58) Field of Classification Search

CPC ...................................................... H10B 41/10
See application file for complete search history.

(56) References Cited

U.S. PATENT DOCUMENTS 10,020,372 B1 7/2018 Lim et al.
11,164,881 B2 * 11/2021 Cai ..................... G11C 11/5628
11,527,543 B2 * 12/2022 Wu ........................ H10B 41/35
11,778,816 B2 10/2023 Huang et al.
11,869,951 B2 * 1/2024 Hsu ........................ H10B 41/30
2021/0226027 A1 7/2021 Huang et al.
2021/0399103 A1 12/2021 Hsu et al.
2023/0171958 A1 * 6/2023 Shuai ..................... H10B 41/40 257/213
2023/0345717 A1 10/2023 Shih et al.

FOREIGN PATENT DOCUMENTS

DE 102020106548 A1 3/2021

OTHER PUBLICATIONS

European Patent Office, Extended European Search Report and Opinion issued in European Patent Application No. 24189047.4 on Nov. 13, 2024; 13 pages.

* cited by examiner

*Primary Examiner* — Daniel Luke
(74) *Attorney, Agent, or Firm* — Thompson Hine LLP

(57) ABSTRACT

Structures for a flash memory cell array and methods of forming a structure for a flash memory cell array. The structure comprises a first gate stack including a first control gate and a second gate stack including a second control gate. The first control gate has a first sidewall, a second sidewall opposite from the first sidewall, and a gate strap region, and the gate strap region includes a projection extending outwardly from the first sidewall of the first control gate. The second control gate has a first sidewall and a second sidewall opposite from the first sidewall, and the second sidewall of the second control gate faces the second sidewall of the first control gate.

20 Claims, 8 Drawing Sheets

FLASH MEMORY CELL ARRAYS WITH A CONTROL GATE STRAP

BACKGROUND

The disclosure relates generally to integrated circuits and semiconductor device fabrication and, more specifically, to structures for a flash memory cell array and methods of forming a structure for a flash memory cell array.

Non-volatile memories are utilized in various electronic products for general storage and transfer of data. Stored data is retained by a non-volatile memory device when the memory cells are not powered. The persistence of data storage by a non-volatile memory device contrasts with data storage by volatile memory technologies, such as a static random-access memory device in which stored data is eventually lost when the memory cells are unpowered and a dynamic random-access memory device in which stored data is lost if the memory cells are not periodically refreshed.

Flash memory is a particular type of non-volatile memory that can be repeatedly programmed with memory logic states and erased. Embedded flash memory may be used to store configuration settings, program code, application parameters, and other types of data in consumer, industrial, and automotive electronic products. Each memory cell in a flash memory cell resembles a standard metal-oxide-semiconductor field-effect transistor but is equipped with a pair of gates instead of a single gate. Current flow in a channel region between a source and a drain is controlled by cooperation between a floating gate and a control gate. The control gate is similar to a standard transistor gate. The floating gate, which is positioned in a gate stack between the control gate and the channel region, is electrically isolated. Charge stored on the floating gate influences the device threshold voltage and thereby provides the different memory logic states.

Improved structures for a flash memory cell array and methods of forming a structure for a flash memory cell array are needed.

SUMMARY

In an embodiment, a structure for a flash memory array is provided. The structure comprises a first gate stack including a first control gate and a second gate stack including a second control gate. The first control gate has a first sidewall, a second sidewall opposite from the first sidewall, and a gate strap region, and the gate strap region includes a projection extending outwardly from the first sidewall of the first control gate. The second control gate has a first sidewall and a second sidewall opposite from the first sidewall, and the second sidewall of the second control gate faces the second sidewall of the first control gate.

In an embodiment, a method of forming a structure for a flash memory array is provided. The method comprises forming a first gate stack including a first control gate and forming a second gate stack including a second control gate. The first control gate has a first sidewall, a second sidewall opposite from the first sidewall, and a gate strap region, and the gate strap region includes a projection extending outwardly from only the first sidewall of the first control gate. The second control gate has a first sidewall and a second sidewall opposite from the first sidewall, and the second sidewall of the second control gate faces the second sidewall of the first control gate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to denote like features in the various views.

DETAILED DESCRIPTION

Figure 1:
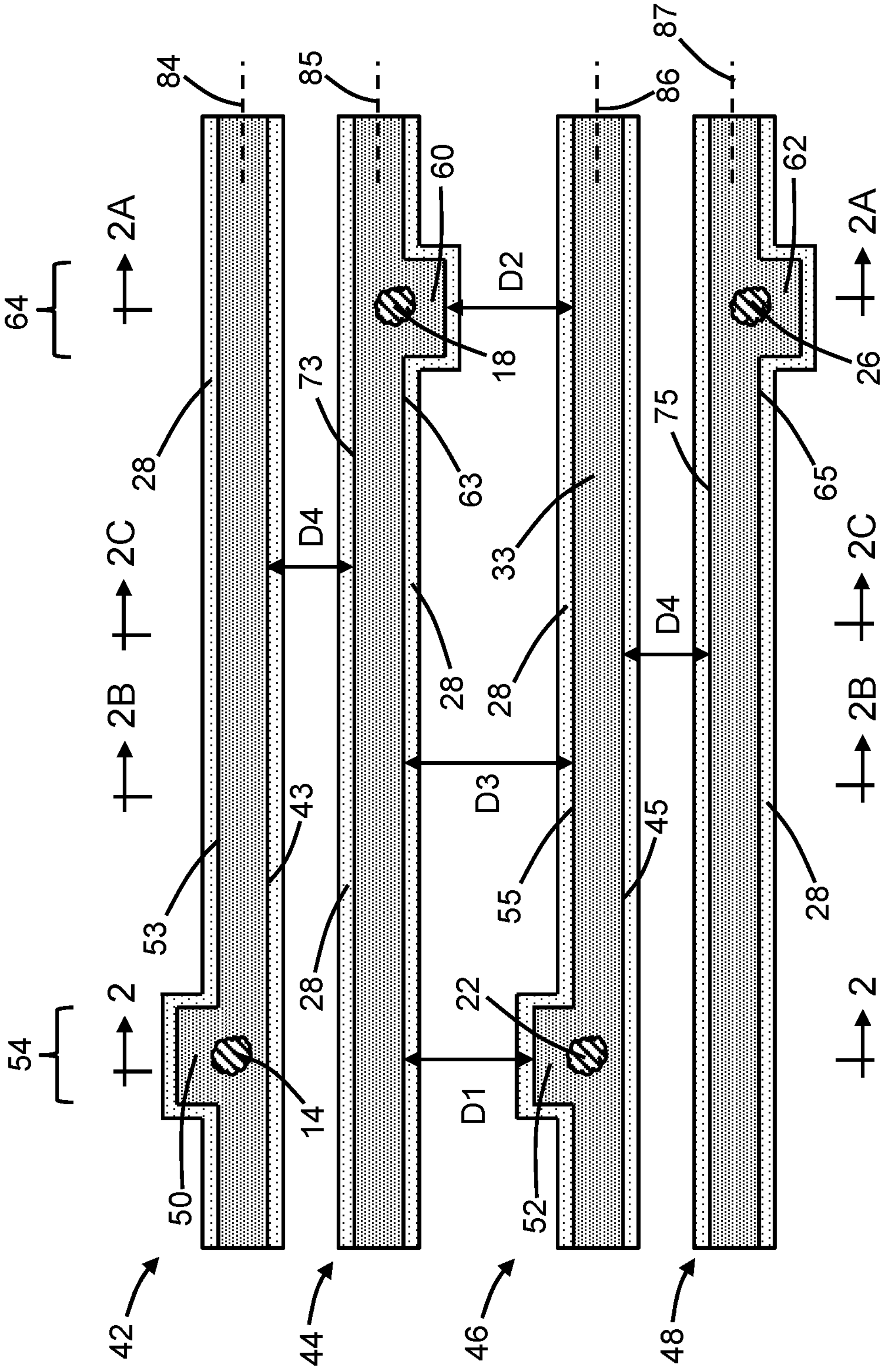
FIG. 1 is a cross-sectional view of a structure for a flash memory cell in accordance with embodiments of the invention.
Figure 2:
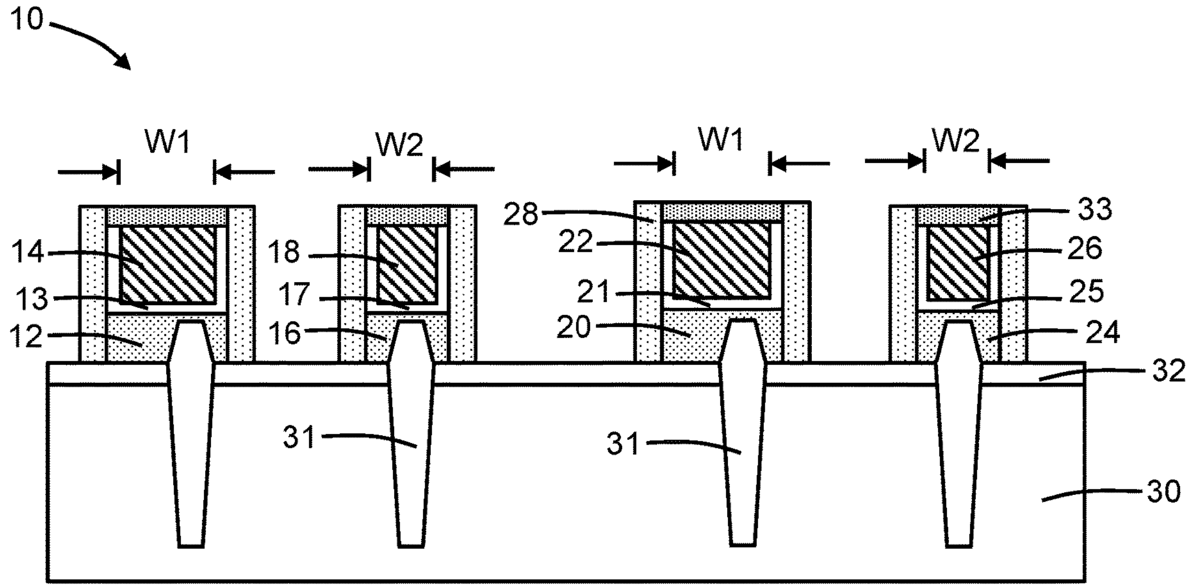
FIG. 2 is a cross-sectional view taken generally along line 2-2 in FIG. 1.
Figure 2A:
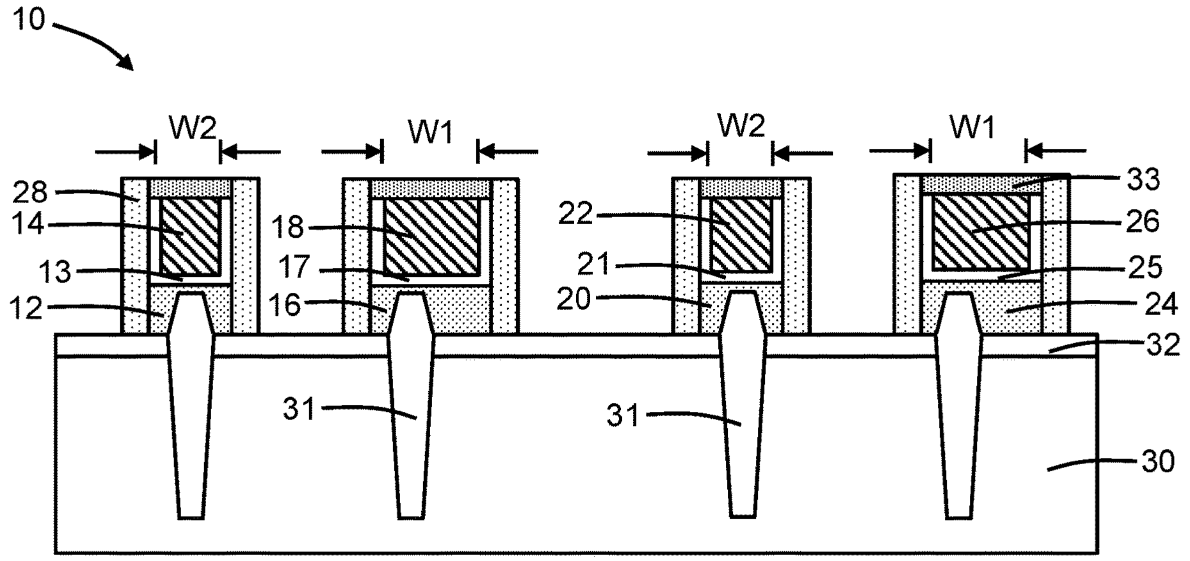
FIG. 2A is a cross-sectional view taken generally along line 2A-2A in FIG. 1.
Figure 2B:
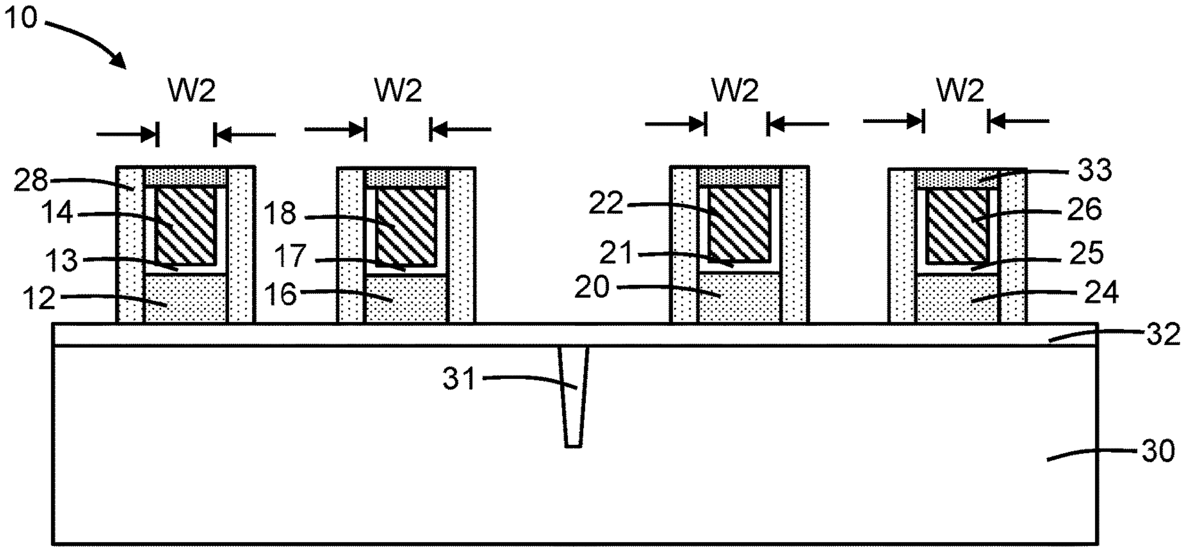
FIG. 2B is a cross-sectional view taken generally along line 2B-2B in FIG. 1.
Figure 2C:
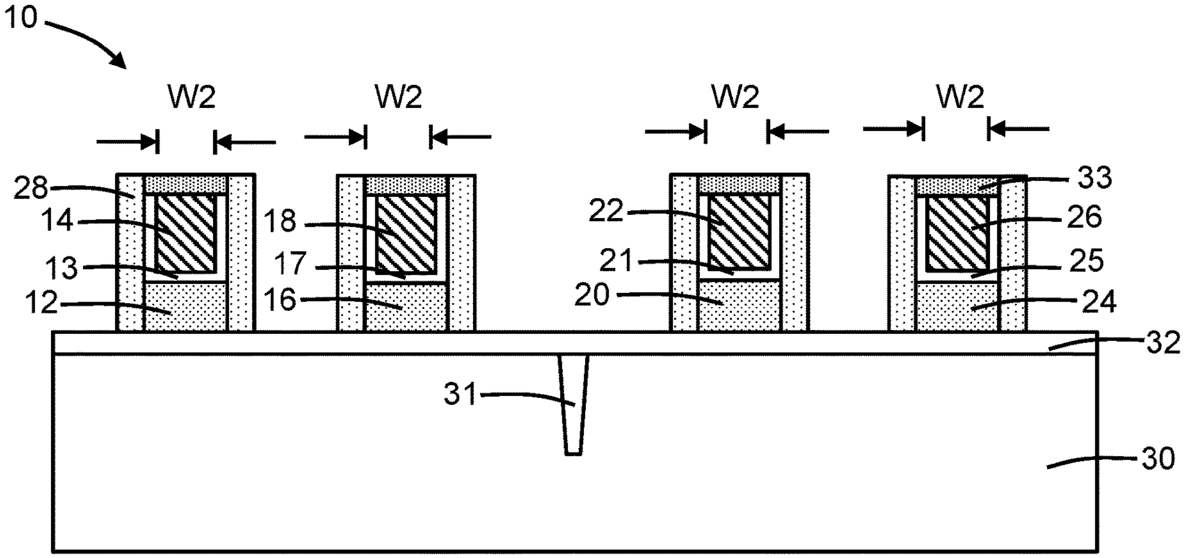
FIG. 2C is a cross-sectional view taken generally along line 2C-2C in FIG. 1.

With reference to FIGS. 1, 2, 2A, 2B, 2C and in accordance with embodiments of the invention, a structure 10 for a flash memory cell array includes a floating gate 12 and a control gate 14 disposed in a gate stack 42, a floating gate 16 and a control gate 18 disposed in a gate stack 44, a floating gate 20 and a control gate 22 disposed in a gate stack 46, and a floating gate 24 and a control gate 26 disposed in a gate stack 48. The gate stack 42 includes a dielectric layer 13 disposed between the floating gate 12 and the control gate 14. The gate stack 44 includes a dielectric layer 17 disposed between the floating gate 16 and the control gate 18. The gate stack 46 includes a dielectric layer 21 disposed between the floating gate 20 and the control gate 22. The gate stack 48 includes a dielectric layer 25 disposed between the floating gate 24 and the control gate 26.

The gate stack 42 is positioned adjacent to the gate stack 44. The gate stack 46 is positioned adjacent to the gate stack 48. The gate stack 44 is positioned laterally between the gate stack 42 and the gate stack 46. The gate stack 46 is positioned laterally between the gate stack 44 and the gate stack 48. The gate stacks 44, 46 are both positioned laterally between the gate stack 42 and the gate stack 48.

The floating gates 12, 16, 20, 24 and the control gates 14, 18, 22, 26 are comprised of a conductive material having a low electrical resistivity, and the dielectric layers 13, 17, 21, 25 are comprised of a dielectric material having a high electrical resistivity relative to the electrical resistivity of the floating gates 12, 16, 20, 24 and the control gates 14, 18, 22, 26. The control gates 14, 18, 22, 26 are electrically isolated from the floating gates 12, 16, 20, 24 by the dielectric layers 13, 17, 21, 25. In an embodiment, the dielectric layers 13, 17, 21, 25 may include multiple sublayers comprised of dielectric materials, such as a sublayer comprised of silicon nitride interposed between upper and lower sublayers comprised of silicon dioxide, the floating gates 12, 16, 20, 24 may be comprised of doped polysilicon, and the control gates 14, 18, 22, 26 may be comprised of doped polysilicon. The gate stacks 42, 44, 46, 48 may be formed by lithography and etching processes.

The gate stacks 42, 44, 46, 48 are disposed on a semiconductor substrate 30, which may be comprised of a semiconductor material such as silicon, with the floating gates 12, 16, 20, 24 and dielectric layers 13, 17, 21, 25 positioned between the control gates 14, 18, 22, 26 and the semiconductor substrate 30. A dielectric layer 32 provides a tunnel dielectric that separates the gate stacks 42, 44, 46, 48 from a channel region in the semiconductor substrate 30. The dielectric layer 32 may be comprised of dielectric material, such as silicon dioxide. Spacers 28 are formed at the periphery of each of the gate stacks 42, 44, 46, 48. The spacers 28 may be formed by conformally depositing a dielectric material, such as silicon nitride, that is an electrical insulator and etching with an anisotropic etching process, such as reactive ion etching. Each of the gate stacks 42, 44, 46, 48 may be covered by a cap layer 33 comprised of a dielectric material, such as silicon nitride. The cap layers 33 may be remnants of a hardmask used during the etching process patterning a layer stack to form the gate stacks 42, 44, 46, 48.

Shallow trench isolation regions 31 may be formed in the semiconductor substrate 30. The shallow trench isolation regions 31 are comprised of a dielectric material, such as silicon dioxide, that is an electrical insulator. The shallow trench isolation regions 31 may be formed by patterning trenches in the semiconductor substrate 30 with lithography and etching processes, depositing a dielectric material to fill the trenches, and planarizing and/or recessing the deposited dielectric material.

The gate stack 42 and the gate stack 46 each have a gate strap region 54 in which the gate stacks 42, 46 have a width dimension W1. The gate strap region 54 of the gate stack 42 includes a projection 50 disposed along the sidewall 53. The projection 50 juts or protrudes outward only from the sidewall 53. The opposite sidewall 43 lacks a projection complementary to the projection 50. The gate strap region 54 of the gate stack 46 includes a projection 52 disposed along the sidewall 55. The projection 52 juts or protrudes outward only from the sidewall 55. The opposite sidewall 45 lacks a projection complementary to the projection 52. Regions of the gate stack 42 and the gate stack 46 adjacent to the gate strap regions 54 have a width dimension W2 that is less than the width dimension W1. The gate stacks 42, 46 extend lengthwise along respective longitudinal axes 84, 86, and the width dimensions W1, W2 of the gate stacks 42, 46 may be measured in a direction transverse to the respective longitudinal axes 84, 86. The gate strap regions 54 are asymmetrical relative to the longitudinal axes 84, 86.

The gate stack 44 and the gate stack 48 each have a gate strap region 64 in which the gate stacks 44, 48 have the width dimension W1. The gate strap region 64 of the gate stack 44 includes a projection 60 disposed along the sidewall 63. The projection 60 juts or protrudes outward only from the sidewall 63. The opposite sidewall 73 lacks a projection complementary to the projection 60. The gate strap region 64 of the gate stack 48 includes a projection 62 disposed along the sidewall 65. The projection 62 juts or protrudes outward only from the sidewall 65. The opposite sidewall 75 lacks a projection complementary to the projection 62. Regions of the gate stack 44 and the gate stack 48 adjacent to the gate strap regions 64 have the width dimension W2 that is less than the width dimension W1. The gate stacks 44, 48 extend lengthwise along respective longitudinal axes 85, 87, and the width dimensions W1, W2 of the gate stacks 44, 48 may be measured in a direction transverse to the respective longitudinal axes 85, 87. The gate strap regions 64 are asymmetrical relative to the longitudinal axes 85, 87.

The projection 52 of the gate strap region 54 of the gate stack 46 is disposed adjacent to the sidewall 63 of the gate stack 44 and projects into the space between the gate stack 44 and the gate stack 46. The sidewall 55 of the gate stack 46 is spaced from the sidewall 63 of the gate stack 44 by a gap having a dimension D1 at the location of the gate strap region 54. The projection 60 of the gate strap region 64 of the gate stack 44 is disposed adjacent to the sidewall 55 of the gate stack 46 and projects into the space between the gate stack 44 and the gate stack 46. The sidewall 63 of the gate stack 44 is spaced from the sidewall 55 of the gate stack 46 by a gap having a dimension D2 at the location of the gate strap region 64. Between the gate strap region 54 and the gate strap region 64, the sidewall 63 of the gate stack 44 is spaced from the sidewall 55 of the gate stack 46 by a gap having a dimension D3 that is greater than the dimension D1 and greater than the dimension D2. In an embodiment, the dimension D1 may be equal to the dimension D2.

The gate stacks 42, 44, 46, 48 are disposed in rows that may extend longitudinally parallel to each other. The sidewall 43 of the gate stack 42 is spaced from the sidewall 73 of the gate stack 44 by a gap having a dimension D4, and the sidewall 43 faces (i.e., is opposite or across the gap from) the sidewall 73. The sidewall 45 of the gate stack 46 is spaced from the sidewall 75 of the gate stack 48 by a gap of the dimension D4, and the sidewall 75 faces the sidewall 45. The sidewall 43 of the gate stack 42 is disposed immediately adjacent to the sidewall 73 of the gate stack 44. The sidewall 45 of the gate stack 46 is disposed immediately adjacent to the sidewall 75 of the gate stack 48. The gap between the sidewall 43 and the sidewall 73 may be constant and have a uniform dimension D4 over an entire length of the gate stacks 42, 44, including the portion of the length within the gate strap regions 54, 64. Similarly, the gap between the sidewall 45 and the sidewall 75 may be constant and have the uniform dimension D4 over an entire length of the gate stacks 46, 48, including the portion of the length within the gate strap regions 54, 64.

The surface area of the control gate 14 of the gate stack 42 and the surface area of the control gate 22 of the gate stack 46 are locally enlarged in size within the gate strap regions 54. The surface area of the control gate 18 of the gate stack 44 and the surface area of the control gate 26 of the gate stack 48 are locally enlarged in size within the gate strap regions 64. The gate strap regions 54 and the gate strap regions 64 facilitate the landing of subsequently-formed control gate contacts on the control gates 14, 18, 22, 26. In an embodiment, the surface areas of the control gates 14, 18, 22, 26 may be equal in the gate strap regions 54, 64.

Figure 3:
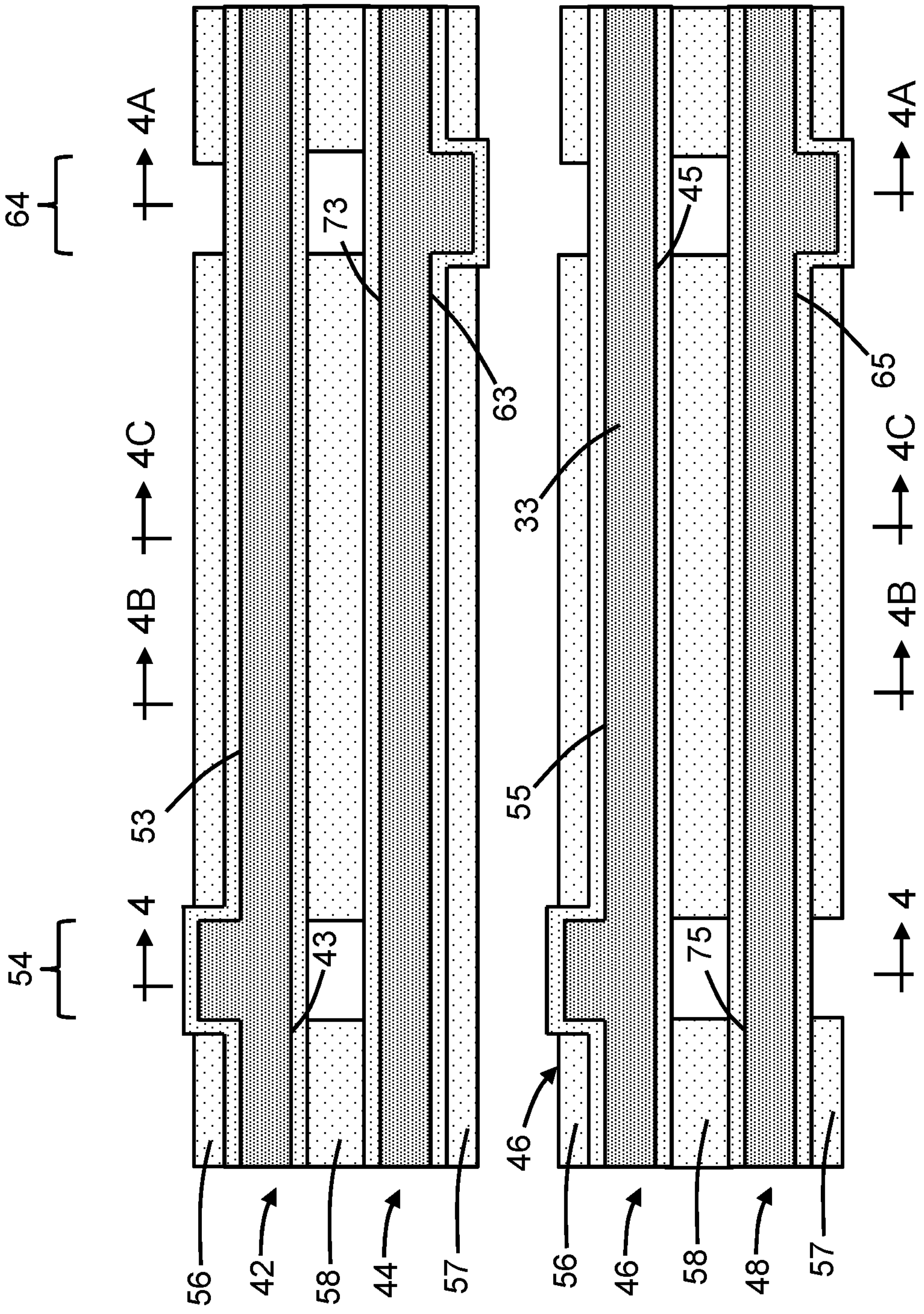
FIG. 3 is a top view of the structure at a fabrication stage subsequent to FIGS. 1, 2, 2A, 2B, 2C.
Figure 4:
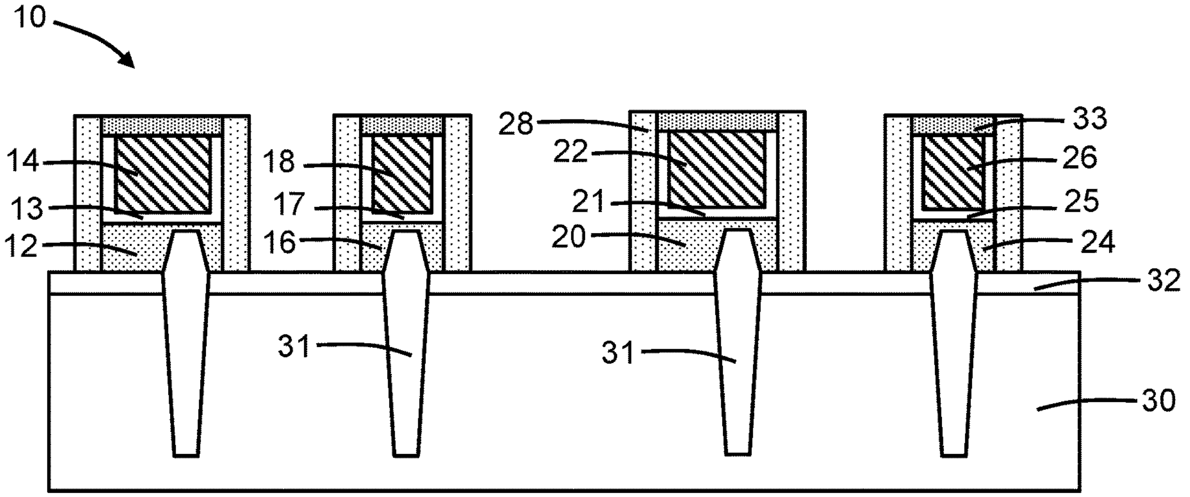
FIG. 4 is a cross-sectional view taken generally along line 4-4 in FIG. 3.
Figure 4A:
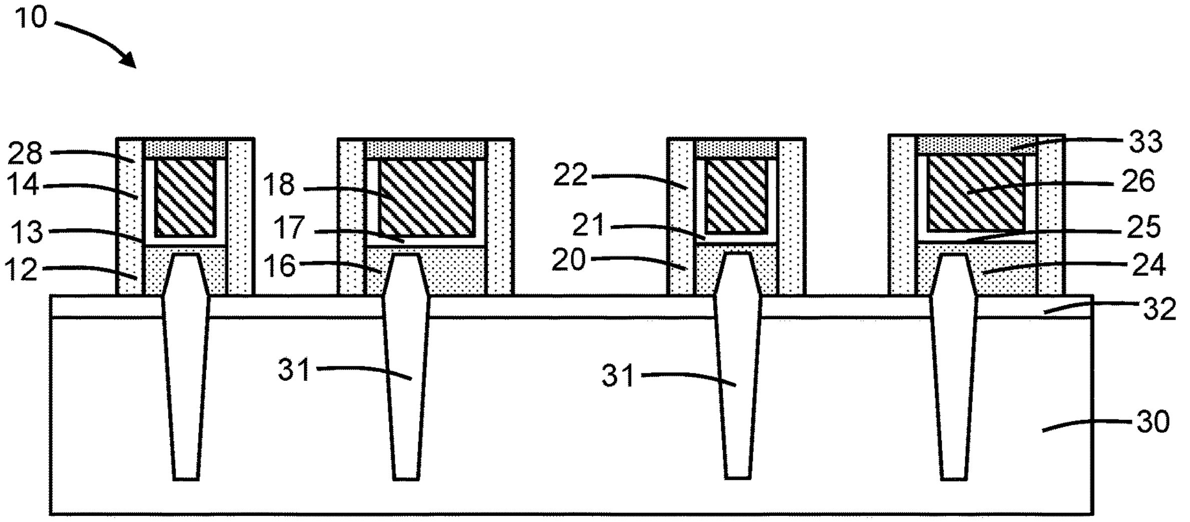
FIG. 4A is a cross-sectional view taken generally along line 4A-4A in FIG. 3.
Figure 4B:
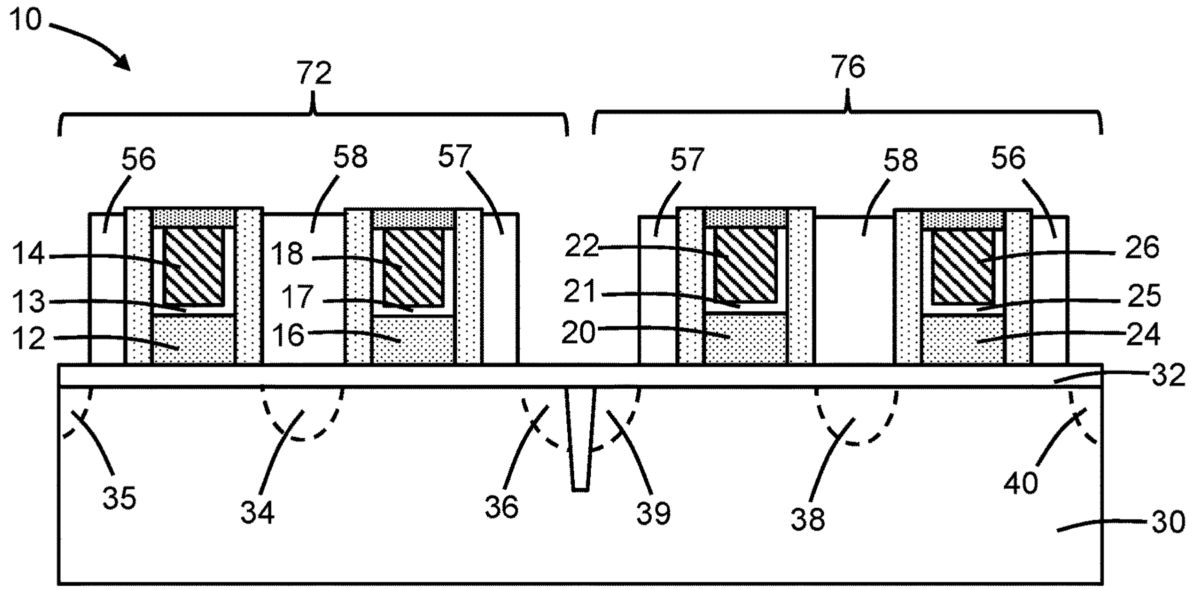
FIG. 4B is a cross-sectional view taken generally along line 4B-4B in FIG. 3.
Figure 4C:
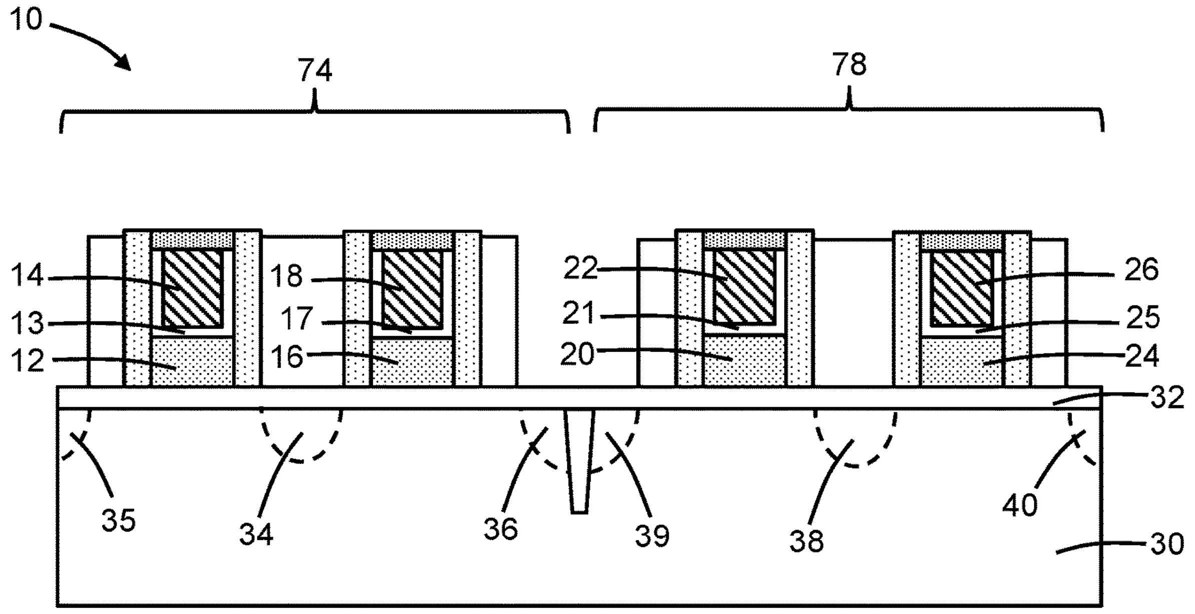
FIG. 4C is a cross-sectional view taken generally along line 4C-4C in FIG. 3.

With reference to FIGS. 3, 4, 4A, 4B, 4C in which like reference numerals refer to like features in FIGS. 2, 2A, 2B, 2C and at a subsequent fabrication stage of the processing method, source/drain regions 34, 35, 36 and source/drain regions 38, 39, 40 may be formed in the semiconductor substrate 30. The source/drain regions 34, 35, 36 and the source/drain regions 38, 39, 40 may be formed by ion implantation of a dopant, such as an n-type dopant (e.g., phosphorus or arsenic). As used herein, the term "source/ drain region" means a doped region of semiconductor material that can function as either a source or a drain.

Mirrored memory cells 72, 74 of the flash memory cell array are associated with the gate stacks 42, 44 and source/drain regions 34, 35, 36 along the lengths of the gate stacks 42, 44 between the gate strap region 54 of the gate stack 42 and the gate strap region 64 of the gate stack 44. In an embodiment, the source/drain region 34 may be a shared source, the source/drain regions 35, 36 may be drains, a channel region may be disposed between the source/drain region 34 and the source/drain region 35 and beneath the gate stack 42, and a channel region may be disposed between the source/drain region 34 and the source/drain region 36 and beneath the gate stack 44.

Mirrored memory cells 76, 78 of the flash memory cell array are associated with the gate stacks 46, 48 and source/drain regions 38, 39, 40 along the lengths of the gate stacks 46, 48 between the gate strap region 54 of the gate stack 46 and the gate strap region 64 of the gate stack 48. In an embodiment, the source/drain region 38 may be a shared source, the source/drain regions 39, 40 may be drains, a channel region may be disposed between the source/drain region 38 and the source/drain region 39 and beneath the gate stack 46, and a channel region may be disposed between the source/drain region 38 and the source/drain region 40 and beneath the gate stack 48.

Select gates 56, 57 and erase gates 58 are formed adjacent to the gate stacks 42, 44 and the gate stacks 46, 48. The mirrored memory cells 72, 74 include a pair of the select gates 56, 57 and one of the erase gates 58 that are associated with the gate stacks 42, 44. The mirrored memory cells 76, 78 also include a pair of the select gates 56, 57 and one of the erase gates 58 that are associated with the gate stacks 46, 48. The select gates 56, 57 and the erase gates 58 may be comprised of doped polysilicon. The select gates 56, 57 and the erase gates 58 may be formed by deposition followed by patterning with lithography and etching processes. One of the erase gates 58 is disposed within the gap between the sidewall 43 of the gate stack 42 and the sidewall 53 of the gate stack 44. One of the erase gates 58 is disposed within the gap between the sidewall 45 of the gate stack 46 and the sidewall 75 of the gate stack 48. Each erase gate 58 is disposed inside one of the gaps over either the source/drain region 34 or the source/drain region 38.

Portions of the doped polysilicon used to form the select gates 56, 57 and erase gates 58 are removed from the vicinity of the gate strap regions 54 and the gate strap regions 64. The dimension D1 between the sidewall 55 of the gate stack 46 and the sidewall 63 of the gate stack 44 at the location of the gate strap region 54 and the dimension D2 between the sidewall 63 of the gate stack 44 and the sidewall 55 of the gate stack 46 at the location of the gate strap region 64, as labeled in FIG. 1, promote and facilitate the efficient removal of the doped polysilicon from those locations. The select gates 56, 57 and erase gates 58 terminate at the side edges of the gate strap regions 54 and the gate strap regions 64. Accordingly, the select gates 56, 57 and the erase gates 58 are absent between the gate stacks 42, 44, 46, 48 in the gate strap regions 54, 64, and the select gates 56, 57 and the erase gates 58 have gaps in their continuity (i.e., discontinuities) in the gate strap regions 54, 64.

Figure 5:
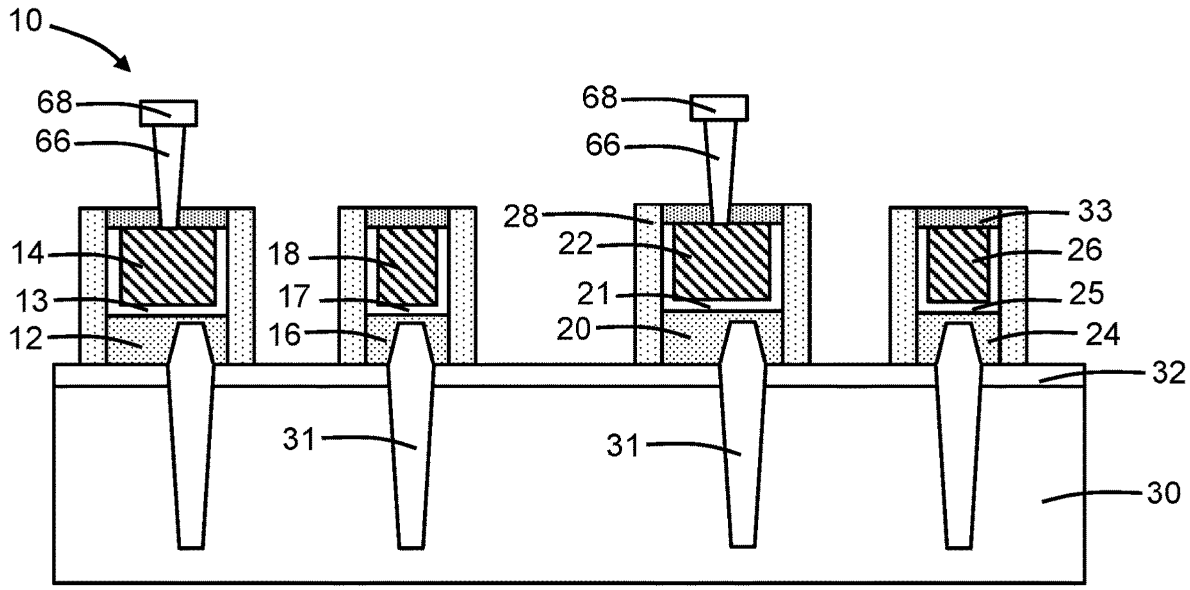
FIGS. 5, 5A, 5B, 5C are cross-sectional views of the structure at a fabrication stage subsequent to FIGS. 3, 4, 4A, 4B, 4C.
Figure 5A:
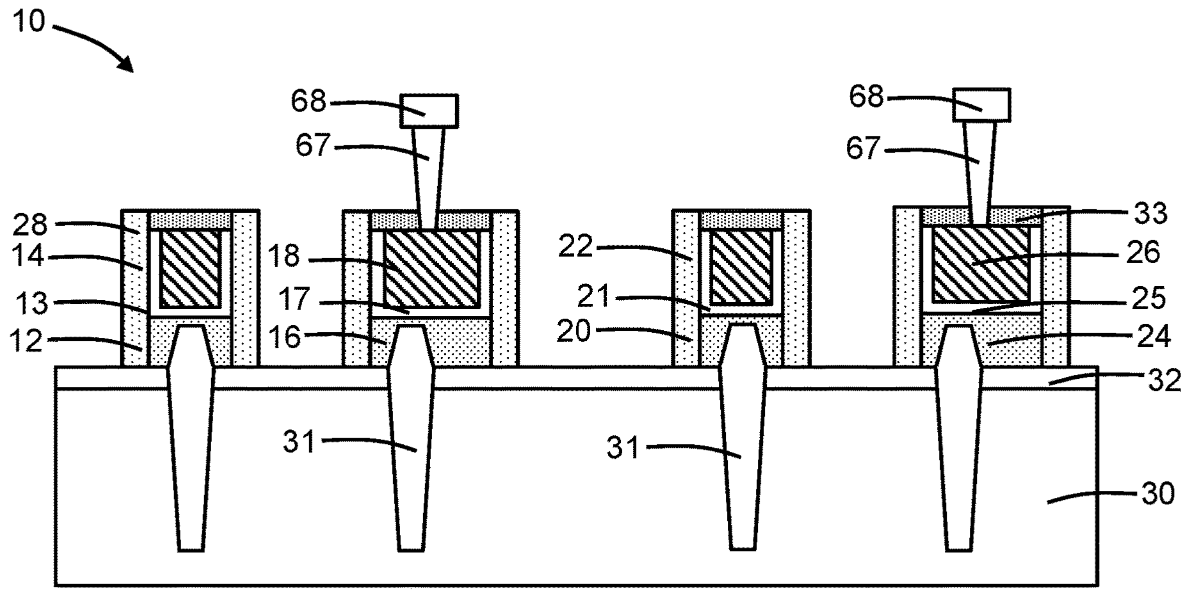
Figure 5B:
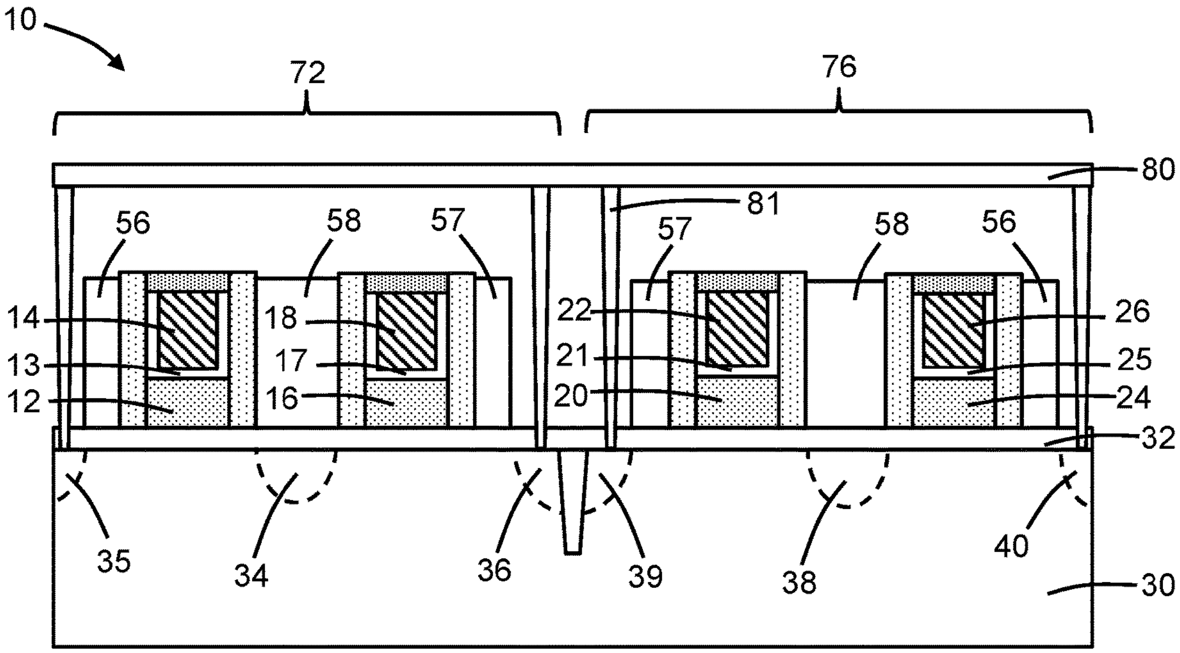
Figure 5C:
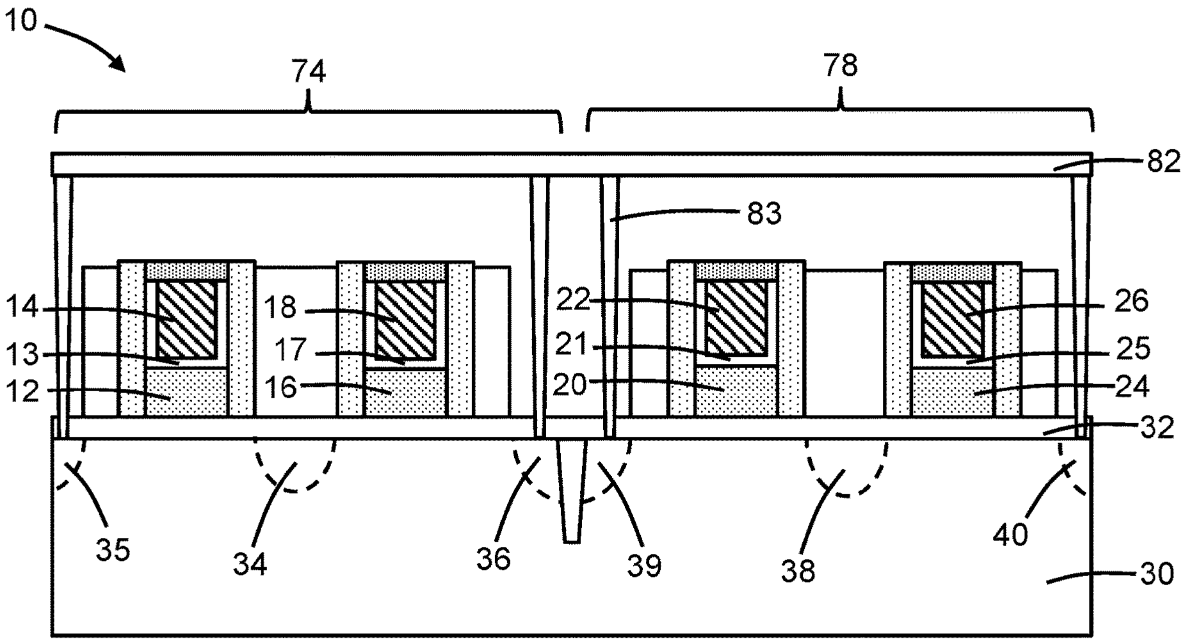

With reference to FIGS. 5, 5A, 5B, 5C in which like reference numerals refer to like features in FIGS. 3, 4, 4A, 4B, 4C and at a subsequent fabrication stage of the processing method, a local interconnect structure or contact level is formed by middle-of-line processing over the mirrored memory cells 72, 74 and the mirrored memory cells 76, 78. The local interconnect structure includes control gate contacts 66, 67 that are arranged in a dielectric layer (not shown). The control gate contacts 66 land on the gate strap regions 54 to provide a physical and electrical contact to the control gate 14 and a physical and electrical contact to the control gate 22. The control gate contacts 67 land on the gate strap regions 64 to provide a physical and electrical contact to the control gate 18 and a physical and electrical contact to the control gate 26.

Back-end-of-line processing is used to form a metallization level of a back-end-of-line stack that includes interconnects 68 that are coupled by the control gate contacts 66 to the control gates 14, 18, 22, 26. A bit line 80 is formed in the back-end-of-line stack that is coupled by contacts 81 to the source/drain regions 35, 36 of the mirrored memory cell 72 and to the source/drain regions 39, 40 of the mirrored memory cell 76. A bit line 82 is formed in the back-end-of-line stack that is coupled by contacts 83 to the source/drain regions 35, 36 of the mirrored memory cell 74 and to the source/drain regions 39, 40 of the mirrored memory cell 78. The bit lines 80, 82 are disposed along the length of the gate stacks 42, 44, 46, 48 between the gate strap regions 54 and the gate strap regions 64. The bit lines 80, 82 extend across the gate stacks 42, 44, 46, 48. In an embodiment, the bit lines 80, 82 may extend transversely across the gate stacks 42, 44, 46, 48.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a flash memory cell array, the structure comprising:

a first gate stack including a first control gate, the first control gate having a first sidewall, a second sidewall opposite from the first sidewall, and a first gate strap region, the first gate strap region including a first projection extending outwardly from only the first sidewall of the first control gate;

a second gate stack including a second control gate, the second control gate having a first sidewall and a second sidewall opposite from the first sidewall, and the second sidewall of the second control gate facing the second sidewall of the first control gate; and an erase gate between the second sidewall of the first control gate and the second sidewall of the second control gate, wherein the erase gate terminates at the first gate strap region.

2. The structure of claim 1 wherein the second sidewall of the second control gate is spaced from the second sidewall of the first control gate by a gap of uniform dimension in the first gate strap region.

3. The structure of claim 1 wherein the first projection of the first gate strap region extends away from the second sidewall of the first control gate.

4. The structure of claim 1 wherein the second sidewall of the second control gate extends parallel to the second sidewall of the first control gate.

5. The structure of claim 1 wherein the second control gate has a second gate strap region, and the second gate strap region includes a second projection extending outwardly from only the first sidewall of the second control gate.

6. The structure of claim 5 wherein the second sidewall of the second control gate is spaced from the second sidewall of the first control gate by a gap of uniform dimension in the first gate strap region and in the second gate strap region.

7. The structure of claim 5 further comprising:

a first contact coupled to the first gate strap region of the first control gate; and a second contact coupled to the second gate strap region of the second control gate.

8. The structure of claim 5 further comprising:

a first memory cell between the first gate strap region and the second gate strap region, the first memory cell including a first portion of the first gate stack and a first source/drain region; and a second memory cell between the first gate strap region and the second gate strap region, the second memory cell including a second portion of the first gate stack and a second source/drain region.

9. The structure of claim 8 further comprising:

a first bit line coupled to the first source/drain region of the first memory cell; and a second bit line coupled to the second source/drain region of the second memory cell, wherein the first bit line and the second bit line are disposed between the first gate strap region and the second gate strap region, and the first bit line and the second bit line extend across the first gate stack and the second gate stack.

10. The structure of claim 5 wherein the first control gate has a first width dimension in the first gate strap region, the second control gate has the first width dimension in the second gate strap region, the first control gate has a second width dimension outside of the first gate strap region, the second control gate has the second width dimension outside of the second gate strap region, and the first width dimension is greater than the second width dimension.

11. The structure of claim 5 wherein the erase gate terminates at the second gate strap region.

12. The structure of claim 5 further comprising:

a first access gate adjacent to the first sidewall of the first control gate.

13. The structure of claim 12 further comprising:

a second access gate adjacent to the first sidewall of the second control gate.

14. The structure of claim 1 further comprising:

a semiconductor substrate, wherein the first gate stack further includes a first floating gate between the first control gate and the semiconductor substrate, and the second gate stack further includes a second floating gate between the second control gate and the semiconductor substrate.

15. The structure of claim 1 wherein the first control gate has a first width dimension in the first gate strap region, the first control gate has a second width dimension outside of the first gate strap region, and the first width dimension is greater than the second width dimension.

16. The structure of claim 1 further comprising:

an access gate adjacent to the first sidewall of the first control gate.

17. A method of forming a structure for a flash memory array, the method comprising:

forming a first gate stack including a first control gate, wherein the first control gate has a first sidewall, a second sidewall opposite from the first sidewall, and a first gate strap region, and the first gate strap region includes a projection extending outwardly from only the first sidewall of the first control gate;

forming a second gate stack including a second control gate, the second control gate having a first sidewall and a second sidewall opposite from the first sidewall, and the second sidewall of the second control gate faces the second sidewall of the first control gate; and forming an erase gate between the second sidewall of the first control gate and the second sidewall of the second control gate, wherein the erase gate terminates at the first gate strap region.

18. The structure of claim 12 wherein the first access gate terminates at the first gate strap region.

19. The structure of claim 13 wherein the second access gate terminates at the second gate strap region.

20. The structure of claim 16 wherein the access gate terminates at the first gate strap region.

* * * * *